(12) United States Patent
Orban

(10) Patent No.: US 6,937,912 B1
(45) Date of Patent: Aug. 30, 2005

(54) ANTI-ALIASED CLIPPING BY BAND-LIMITED MODULATION WITH STEP FUNCTIONS

(75) Inventor: Robert A. Orban, Belmont, CA (US)

(73) Assignee: Orban, Inc., San Leandro, CA (US)

( * ) Notice: Subject to any disclaimer, the term of this patent is extended or adjusted under 35 U.S.C. 154(b) by 0 days.

(21) Appl. No.: 09/543,852

(22) Filed: Apr. 5, 2000

Related U.S. Application Data

(60) Provisional application No. 60/129,800, filed on Apr. 16, 1999.

(51) Int. Cl.[7] ............................ G06F 17/00; H03G 7/00
(52) U.S. Cl. ........................... 700/94; 381/106; 333/14
(58) Field of Search .................. 381/106, 101, 381/94.5, 102, 107, 108, 94.1, 94.7; 333/14; 700/94

(56) References Cited

U.S. PATENT DOCUMENTS

| | | | |
|---|---|---|---|
| 4,103,243 A * | 7/1978 | Orban | 327/309 |
| 4,208,548 A | 6/1980 | Orban | |
| 4,460,871 A | 7/1984 | Orban | |
| 4,949,177 A * | 8/1990 | Bannister et al. | 348/584 |
| 5,574,791 A | 11/1996 | Orban | |
| 5,642,383 A * | 6/1997 | Suzuki | 375/241 |
| 5,737,432 A | 4/1998 | Werrbach | |
| 5,737,434 A | 4/1998 | Orban | |
| 5,821,889 A * | 10/1998 | Miller | 341/139 |
| 5,844,512 A * | 12/1998 | Gorin et al. | 341/139 |
| 5,913,152 A * | 6/1999 | Hemphill | 455/43 |
| 5,929,795 A | 7/1999 | Wang | |
| 6,023,191 A | 2/2000 | Connell et al. | |
| 6,256,395 B1 * | 7/2001 | Melanson | 381/312 |
| 6,337,999 B1 * | 1/2002 | Orban | 700/94 |
| 6,434,241 B1 * | 8/2002 | Orban | 381/106 |
| 6,760,452 B2 * | 7/2004 | Lau et al. | 381/106 |

* cited by examiner

*Primary Examiner*—Xu Mei
(74) *Attorney, Agent, or Firm*—Blakely, Sokoloff, Taylor & Zafman LLP

(57) ABSTRACT

A method for computing the "clippings" of an audio signal in the digital domain to prevent aliasing is disclosed. An offset signal is found by subtracting a threshold from samples of the audio signal. These are multiplied by a pulse after the pulse is lined up in time with the crossing of the audio signal at the threshold. The pulse is the sum of two step functions, both of which are bandwidth-limited.

12 Claims, 7 Drawing Sheets

ANTI-ALIASED CLIPPING BY BAND-LIMITED MODULATION WITH STEP FUNCTIONS

Priority is claimed to Provisional Application Ser. No. 60/129,800, filed Apr. 16, 1999.

BACKGROUND

1. Field of the Invention

The invention relates to the clipping of audio signals in the digital domain.

2. Prior Art

Audio signals are frequently clipped at a positive and a negative threshold particularly in the broadcast field to prevent overmodulation of the transmitter, which is ordinarily defined by government regulation. In most instances, the "clippings" (that is the signal that remains above or below a threshold) are used in subsequent processing. Sometimes, even when some subsequent processing is done in the digital domain, the clipping itself is performed in the analog domain. Simple clipping in the digital domain (defined as setting to the positive or negative threshold of clipping any sample that exceeds the respective threshold of clipping) introduces additional distortion in the form of aliasing and jitter, thus the use of clipping in the analog domain has persisted.

The use of "clippings" for signal processing is described in U.S. Pat. No. 5,737,434 entitled "Multi-Band Audio Compressor with Look-Ahead Clipper" and U.S. patent application Ser. No. 09/216,345, filed Dec. 18, 1998, entitled "Oversampled Differential Clipper."

If the subsequent processing of the "clippings" consists only of linear operations like summation and linear filtering (which is typically true), it should be particularly noted that anti-aliasing the "clippings" then completely anti-aliases subsequent processing using the "clippings," because the "clippings" contain all of the non-linear spectrum added by this processing to the unprocessed signal.

SUMMARY OF THE INVENTION

A method for computing the anti-aliased "clippings" of a bandlimited signal in the digital domain is described. Values of a predetermined threshold are subtracted from each sample of the signal to provide an offset signal. The offset signal is multiplied by a pulse consisting of the sum of a first bandlimited step and a second bandlimited step where the second bandlimited step occurs in a direction opposite to the first step. The resulting anti-aliased "clippings" can be used to produce an anti-aliased clipped signal or for the anti-aliasing of other signal processing as described in U.S. Pat. No. 5,737,434 entitled "Multi-Band Audio Compressor with Look-Ahead Clipper" and U.S. patent application Ser. No. 09/216,356, filed Dec. 18, 1998, entitled "Oversampled Differential Clipper" and assigned to the assignee of the present invention. For example, to produce an anti-aliased clipped signal, the anti-aliased "clippings" are subtracted from the unclipped signal. With appropriate additional filtering of the anti-aliased "clippings," they can also be used to create an anti-aliased overshoot compensator, such as that described in U.S. Pat. No. 4,460,871, entitled "Overshoot Protection Circuit," or to produce a distortion-canceling clipper such as that described in U.S. Pat. No. 4,208,548, entitled "Smart Clipper."

DETAILED DESCRIPTION OF THE PRESENT INVENTION

In the following description, derivation of the "clippings" (also called the "error signal" below) is modeled as a process in which an offset version of the unclipped analog signal is multiplied by step functions defining a pulse. Anti-aliasing and jitter reduction by bandlimiting the step functions are achieved. In part this occurs by resampling the step functions to align them with the true time of transition between clipping and non-clipping. To this end, in the following description numerous specific details are set forth, such as specific frequencies. It will be apparent to one skilled in the art that the present invention may be practiced without these specific details. In other instances, well-known processes and circuits have not been disclosed in detail in order not to obscure the present invention.

Figure 1:
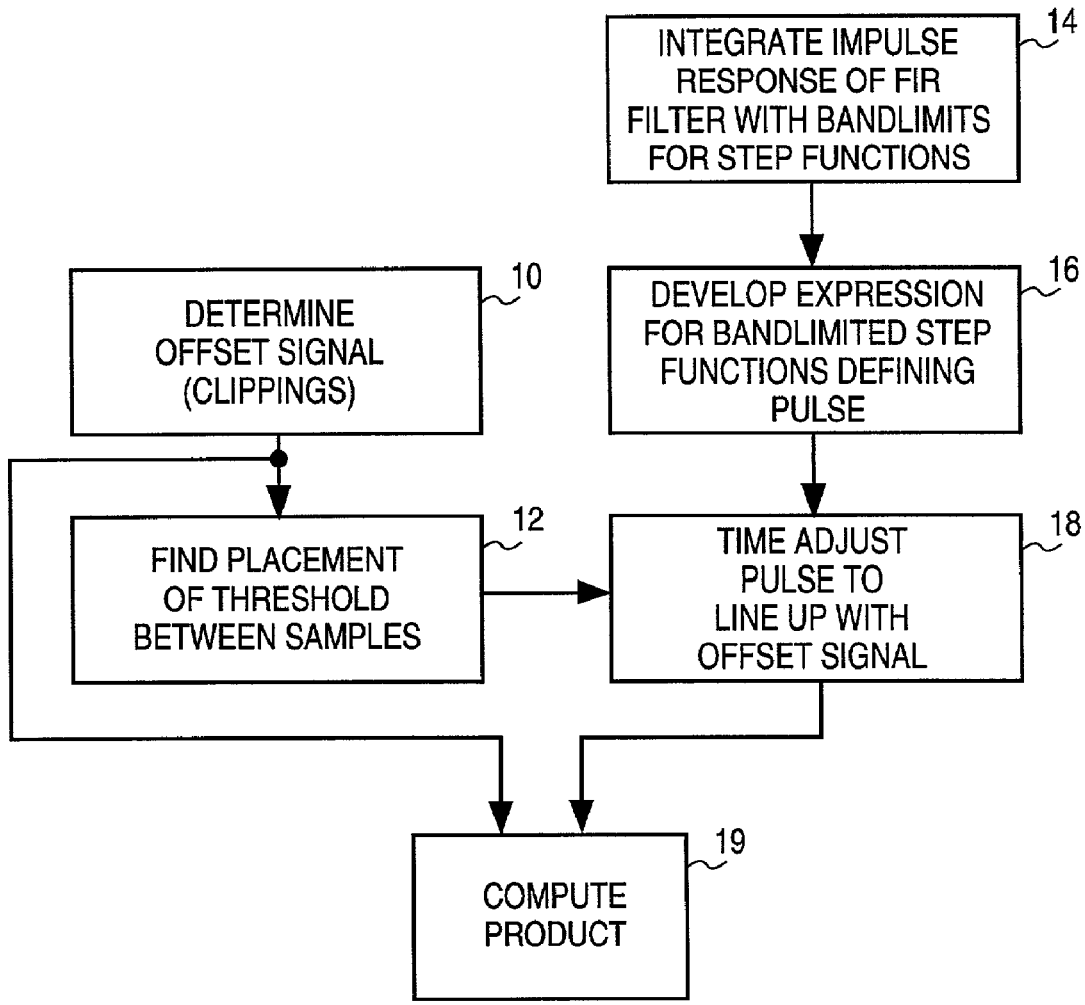
FIG. 1 illustrates the steps of the present invention.
Figure 2:
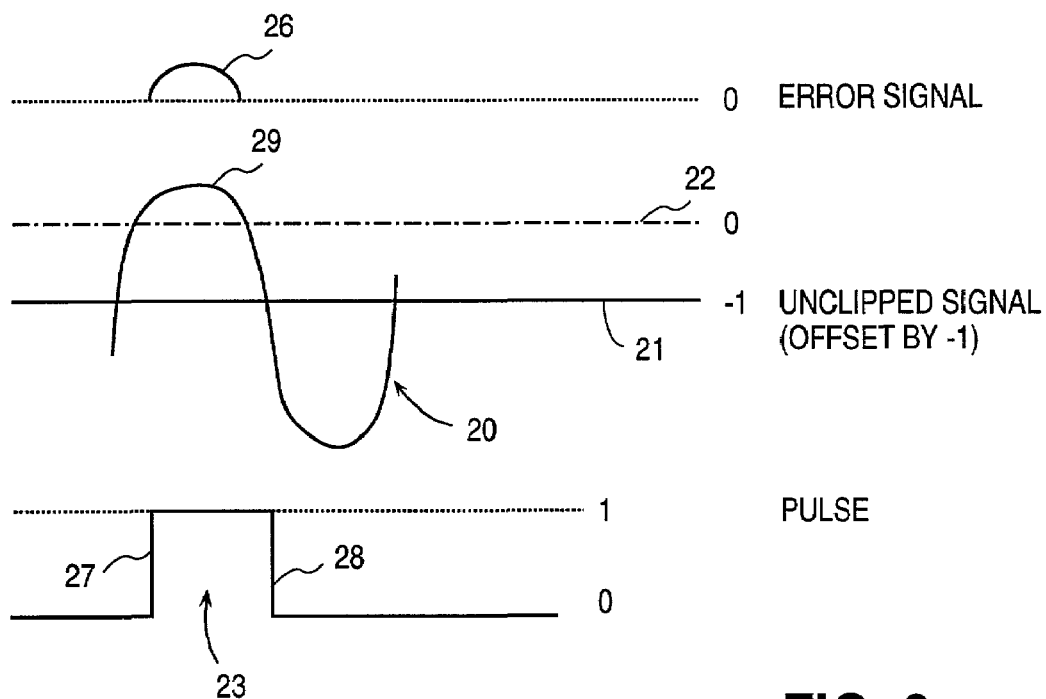
FIG. 2 is a graph illustrating a pulse, unclipped analog signal and an error signal, said error signal representing the "clippings."

Referring first to FIG. 1, steps of the present invention are shown with details of each step described later below. In step 10 an offset signal 29 (shown in FIG. 2) is found by subtracting the value of a predetermined clipping threshold from each of the samples of a bandlimited analog signal 20. Referring briefly to FIG. 2 the analog signal 20 is shown which typically is a bandlimited sampled, unclipped signal (e.g., 0–15 kHz). In one embodiment the positive-going portions of this signal are offset by a predetermined threshold of −1, shown by line 21. The samples of the analog signal 20 that exceed line 22 represent the offset signal. An offset signal is also found by offsetting to, for instance, +1 for the negative portions of the analog signal to obtain a negative offset. These offsets represent the threshold of clipping and are used to permit the multiplication by the pulse 23 (shown in FIG. 2) to yield the error signal 26, as will be discussed. There are also negative-going error signals not shown.

The points at which the analog signal crosses line 22 most likely will not line up precisely with samples of the analog signal 20. As will be described in conjunction with FIG. 3, the placement of this crossing between the samples is determined each time the analog signal crosses line 22 and the equivalent line for the negative portions of the signal. This is shown by step 12 of the FIG. 1.

The offset signal is modulated by the pulse 23 by multiplying these two signals. This pulse is made up of a summation a pair of step functions, positive-going step function 27 and negative-going step function 28. (In fact, the first step function 27 goes from 0 to 1 and the second step function goes from 0 to −1, so that their sum yields the pulse 23.) These step functions are bandlimited and are defined by integrating the impulse response of a finite impulse response (FIR) filter having band limits as shown by step 14.

Next, as shown by step 16, mathematical expressions are developed that approximate the step functions. These expressions allow, in effect, resampling of the step functions so that the step functions can be aligned in time with the actual samples representing the analog signal. This is shown by step 18.

Finally, as shown in FIG. 1 by step 19, the offset signal is multiplied by the adjusted pulse to obtain a product, the error signal 26 shown in FIG. 2.

The present invention relies on amplitude modulation theory in that the bandwidth of the product of two band-limited signals is equal to the sum of their bandwidths. This is true because one signal creates symmetrical positive and negative sidebands around each Fourier component of the other signal. The unclipped analog signal is limited to a small bandwidth by comparison to its Nyquist frequency. (In one embodiment, the Nyquist frequency is 256 kHz and the bandwidth of the analog signal is 15 kHz.) Therefore, if the pulse is bandlimited to 256–30 kHz, or 226 kHz, there will theoretically be no aliasing. This example illustrates that it is possible to permit the transition region of the filter in 14 to alias around 128 kHz (the Nyquist frequency) back to 30 kHz. The subsequent multiplication of the band-limited step function by the unclipped signal will create a lower sideband 15 kHz wide extending from 15 kHz to 30 kHz. Thus the sideband does not encroach into the 0 to 15 kHz baseband, and aliasing is prevented.

The pulse 23 of FIG. 2 can be looked at as the superposition of two step functions, one going from 0 to +1 and the other, later, function going from 0 to −1. A bandlimited step function can be created by numerically integrating the impulse response of an FIR filter with a passband from 0 to 15 kHz and a stopband from 226 to 256 kHz. Such a filter can be realized with the standard McClellan-Parks-Rabiner (MPR) algorithm and with a 7-tap impulse response. Upon numerical integration the corresponding step response is $$\{0, -0.0171, -0.0344, 0.1078, 0.5, 0.8922, 1.0344, 1.0171, 1\} \quad (1)$$

This step response of a phase-linear filter is antimetric around its center value of 0.5.

While it may appear that simply replacing the pulse waveform with the step response in Eq.(1) would adequately anti-alias the clipper, there is another source of undesired spectrum. If the edges of the pulse are lined up with the zero-valued samples on either side of a non-zero part of the error signal, the width of the pulse will depend on the time relationship between the sample clock and the material being clipped. For a sine wave, the width of the pulse is likely to change with each cycle. This is a form of jitter, which causes frequency modulation of the error signal that adds undesired sidebands. This is not, strictly speaking, "aliasing," but has a similar undesirable effect. Therefore, to ensure spectral purity, more must be done than simply bandlimit the pulse wave.

To eliminate jitter, it is necessary to align the center of the step response with the true threshold of clipping, which usually occurs between samples, as mentioned. The technique of linear interpolation can be used, although other, more expensive methods of interpolation (like Lagrange interpolation) could alternatively be used to improve accuracy.

Figure 3:
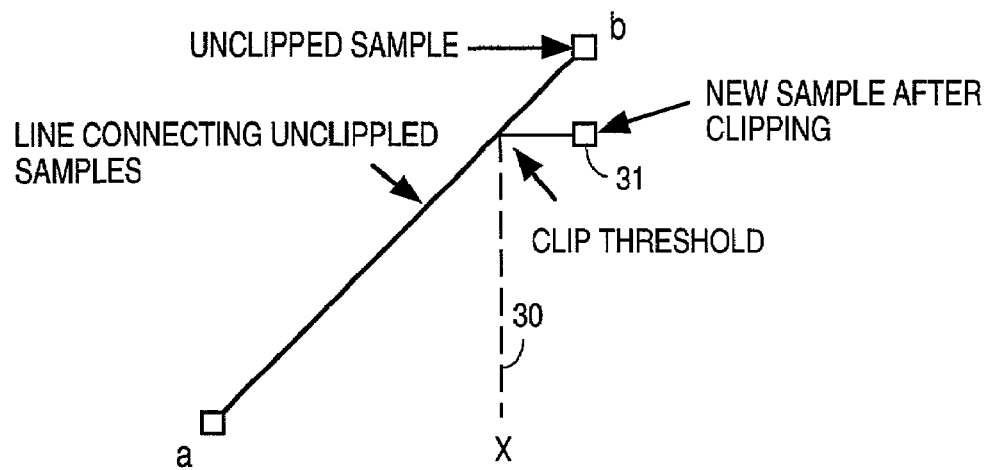
FIG. 3 is a diagram used to illustrate locating the threshold between samples of the analog signal.

In the case of linear interpolation, assume the unclipped signal has a pair of samples, a and b, as shown in FIG. 3, corresponding to a pair of samples that bound or bracket the threshold, that are connected with a straight line. The slope of the line is (b−a)/1, and the equation describing the line in rectangular coordinates is y=(b−a)x+a. Assume further the threshold of clipping is±1, depending of whether b is positive or negative. To solve for x when y is at the threshold of clipping, the results is $$x = \pm 1 - a/b - a \quad (2)$$

Unfortunately, this requires one divide operation, which is expensive in most DSPs. However, it is the only operation in the algorithm that is not a compare, add, or multiply. The placement of the threshold is shown in FIG. 3 at line 30 along with the value 31 after clipping.

The problem is to derive a method to line up the center of the step response at exactly point x. To do this, a polynomial expression is fitted to the step response in Eq.(1). Because the step response is antimetric, all the even-order polynomial coefficients equal zero. The following polynomial, obtained by a least-squares fit, provides a good interpolation from−3 to+3:

$$0.5 + 0.44958667z - 0.06180222z^3 + .0045369444z^5 - 0.00012139889z^7 \quad (3)$$

Computationally, this is most efficiently realized as $$0.5 + (+0.4495867 + (-0.06180222 + (0.00453694440.0001213889zs)zs)zs) \quad (4)$$

where zs=z².

The polynomial is not very well behaved−4=x<−3 and 3<x≦4. Therefore a linear interpolation is used in these regions.

Once the interpolated value of x in Eq.(2) are known, it is easy to compute the necessary values of z to insert into Eq.(3). For example, if x= 0.7, then the four positive-time samples occur at z=0.3, 1.3, 2.3, and 3.3, and the four negative-time samples occur at z=−0.7,−1.7,−2.7, and−3.7. The general formula for the positive-time samples is z=n+ (1−x), n=0, 1, 2, 3 and the general formula for the negative-time samples is z=−(n+x), n= 0,−1,−2,−3.

The process described above replaces four samples above and four samples below the transition between clipping and no-clipping. This means that, for higher frequencies, there is sometimes considerable overlap between the added samples associated with the various zero crossings of the error signal. (It is important to code the algorithm in such a way that overlaps are added instead of having a later step response truncate an earlier one.) Experiments have been calculated where the process is time-compressed by a factor of two. In other words, replace two samples above and two samples below the zero crossing, and replace z in Eq.(3) by 2z This halves the rise time of the step function. Simulation revealed that this operation did not cause any loss of anti-aliasing and, in fact, improved it somewhat for higher sinewave frequencies. Because it reduces the necessary computation and reduces the need to account for overlaps, it is used for a modified algorithm instead of the one discussed above.

Replacing z by 2z in Eq.(3) results in a new polynomial.

$$0.5 + 0.899172z - 0.4944176z^3 + 0.14518208z^5 - 0.015537664z^7. \quad (5)$$

This is valid for $-1.5 \leq z \leq 1.5$. Outside that range, linear interpolation is used.

It should be noted that for each half-cycle of clipping the steps for determining the placement in time of the threshold between the samples and computing the values of the step functions using this placement is actually performed twice. Specifically, once for the leading edge of the error signal and once for the trailing edge. The two step functions are different: the step function at the leading edge goes from 0 to+1 and the step function at the trailing edge from 0 to-1 (this is derived by multiplying every sample in the 0 to+1 step function by-1). After summing the two step functions, a pulse function that goes from 0 to some maximum positive value and then back to 0 is obtained. If the width of the error signal is small, the resultant pulse, although always symmetrical, may never reach a value of+1 at its center. This is consistent with what occurs if a narrow pulse were to be passed through an anti-aliasing filter prior to an analog-to-digital conversion.

While the discussion above contemplates a computation, in another embodiment a look-up table representing the step function is used. In one embodiment, this table has 64 elements and provides 16 bins between each sample. The table is derived from the numerical integration of the impulse response (tap values) of a length 129 symmetrical FIR lowpass filter, computed assuming an 8192 kHz-sample frequency. To get the 64 elements in the table, the integration occurs by summing two FIR taps per table element to the integrand, where the value stored in bin #1 is the sum of the first two taps of the generating FIR filter.

To generalize, if four-sample anti-aliasing is used and the desired length of the table is nt, then the length of the generating FIR filter is (2 nt+1) and it must be designed for a sampling frequency of (0.5 nt fs) where fs is the sampling frequency of the unprocessed audio. (fs=256 kHz in our example.)

First, again the determination is made of the placement of the threshold between the samples of the analog signal that bound the threshold by interpolation as discussed above. Then, the look-up table is lined up so that its center bin is centered on the computed threshold: "x" in FIG. 3. It is then determined which four bins line up with the four samples straddling the threshold. The values are read in these bins from the lookup table, and we multiply the four samples by these values. In our example, the four bins will each be 16 bins apart. The look-up table therefore actually represents a resampling and subsequent subsampling of the oversampled step function stored in the table. For example, if one chooses samples in the table that are 16 samples apart, this represents sub-sampling of the original L=129 generating FIR filter by 32x. This will cause the frequency response of the generating filter to alias. In the example above, the stopband of the generating filter extends from 226 kHz to 4096 kHz. After 32x subsampling, the filter's stopband will fold around itself 32 times. When this occurs, the edge of the stop band will alias to 30 kHz because the sample frequency is 256 kHz and 226 kHz aliases to 30 kHz in a 256 kHz-sample frequency system. The stopband will therefore contain modulation sidebands to the 15–30 kHz frequency range, protecting the 0 to 15 kHz range, which is what is desired.

It should also be noted that the above method may be applied to an oversampled clipper. In this event, aliasing occurring above the 15 kHz bandpass is acceptable because all this energy will eventually be removed during the downsampling—for example, from 256 kHz back to 32 kHz. This oversampling clipper technology is discussed in U.S. patent application Ser. No. 09/216,345, filed Dec. 18, 1998, entitled "Oversampled Differential Clipper."

Figure 4:
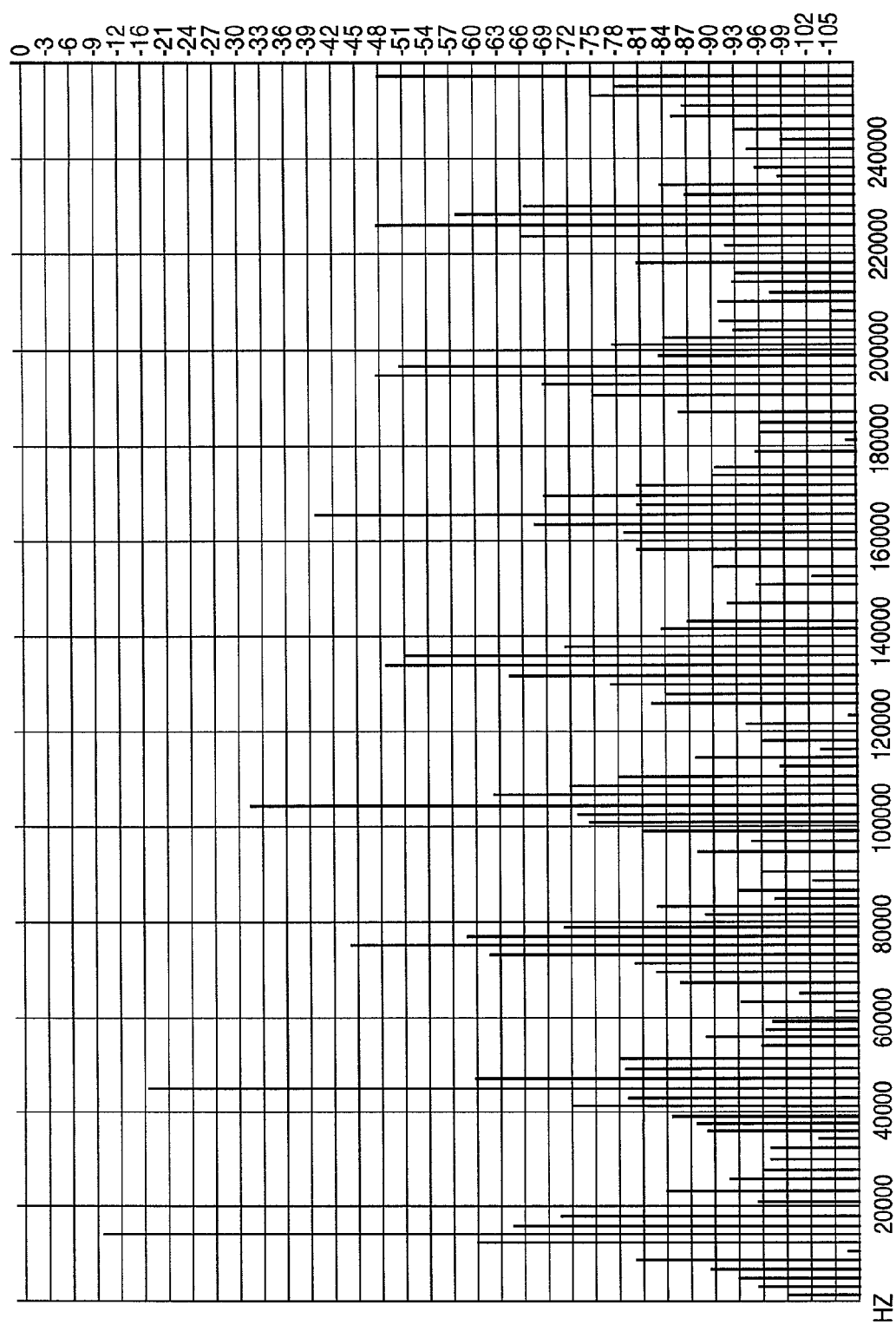
FIG. 4 illustrates the error signal of 15 kHz clipped 4 dB with no anti-aliasing.
Figure 5:
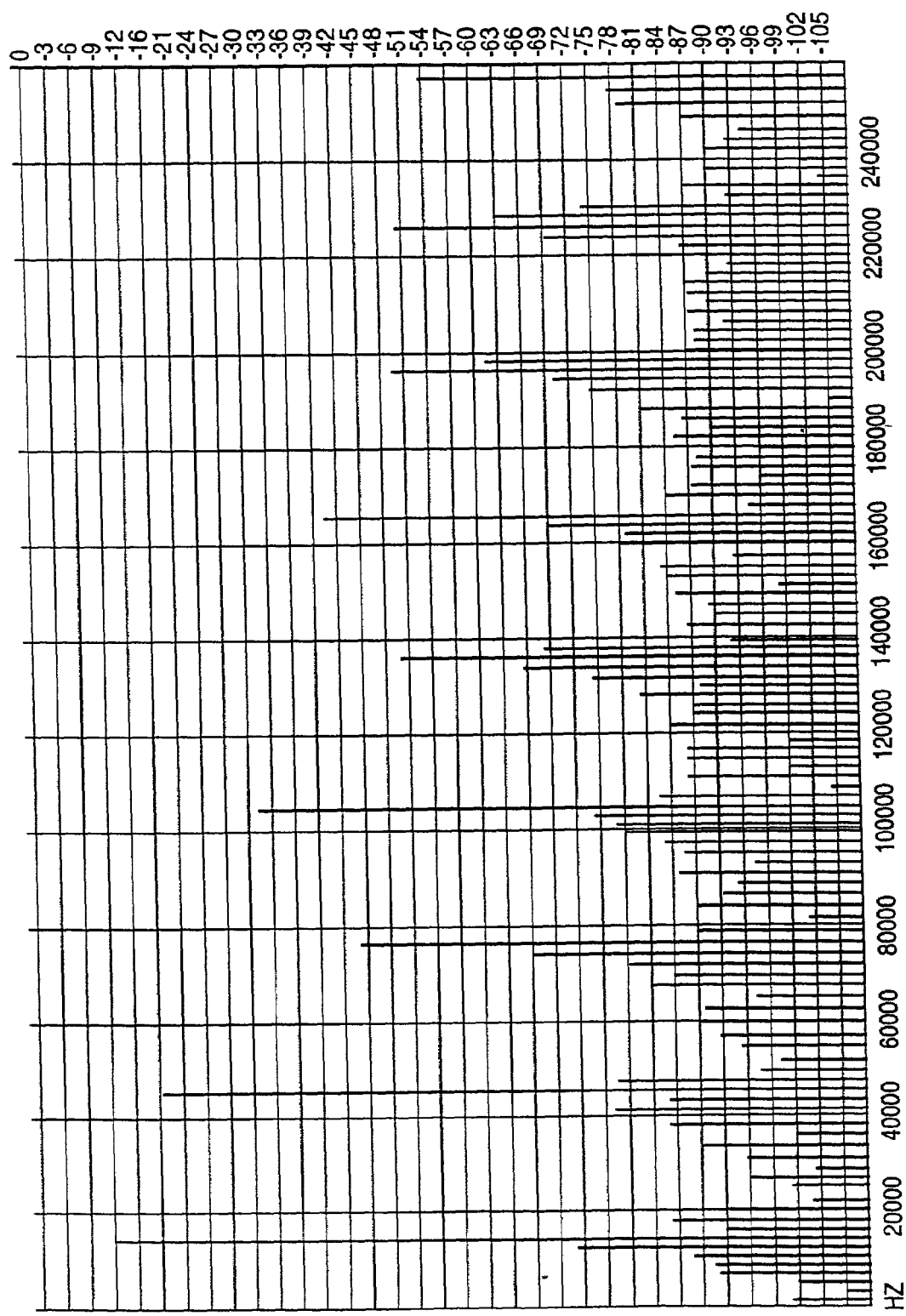
FIG. 5 illustrates the error signal of 15 kHz clipped 4 dB where two points are used for the anti-aliasing as taught by the present invention.
Figure 6:
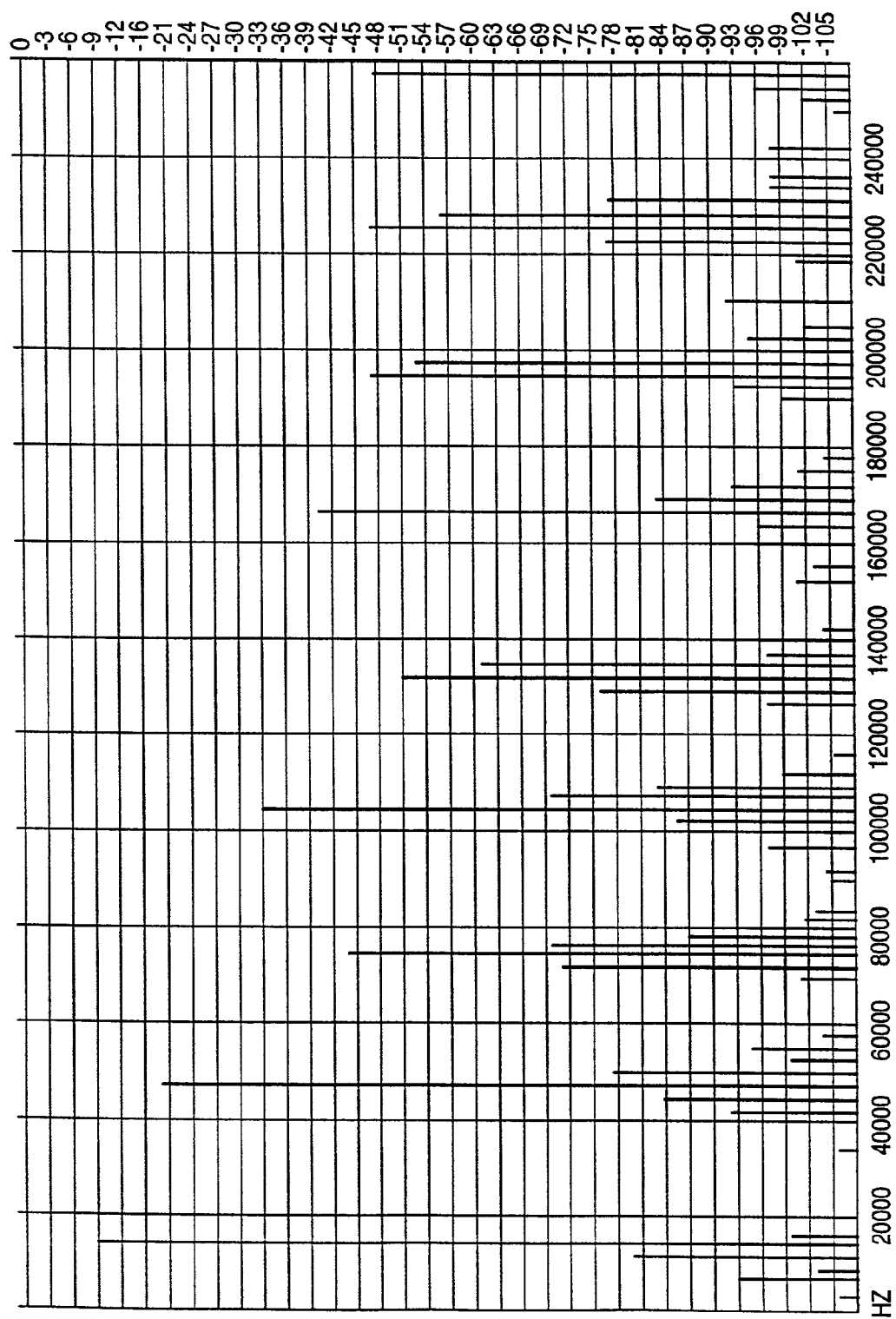
FIG. 6 illustrates the error signal of 15 kHz clipped 4 dB where four points are used for the anti-aliasing as taught by the present invention.

Very approximately, the technique using four-sample interpolation (two samples above and two below the zero crossing) is twice as effective (on a dB scale) as a two-sample interpolation technique. FIGS. 4, 5 and 6, respectively below show spectrograms for a 15 kHz sinewave clipped 4 dB for no anti-aliasing, two-sample anti-aliasing using the preferred technique, and four-sample anti-aliasing using the preferred technique. Only spurious spectrum below 15 kHz is of interest, because all other spectrum will be removed in the course of downsampling from 256 kHz to 32 kHz sample rate.

Continuing our example where the ultimate system sample frequency is 32 kHz (after downsampling from 256 kHz), ringing in the error signal occurs in the time domain after the system reconstruction filter. This is the familiar Gibbs' phenomenon and is consistent with the results of sampling a signal at 32 kHz that was originally clipped in the analog domain, assuming that a correct anti-aliasing filter was used before the sampler. This is because the clipped analog signal contains frequencies above 16 kHz, and the anti-aliasing filter will remove some of these, causing overshoot due to spectral truncation. Overshoot compensation used in typical broadcast processing systems deals with this.

Figure 7:
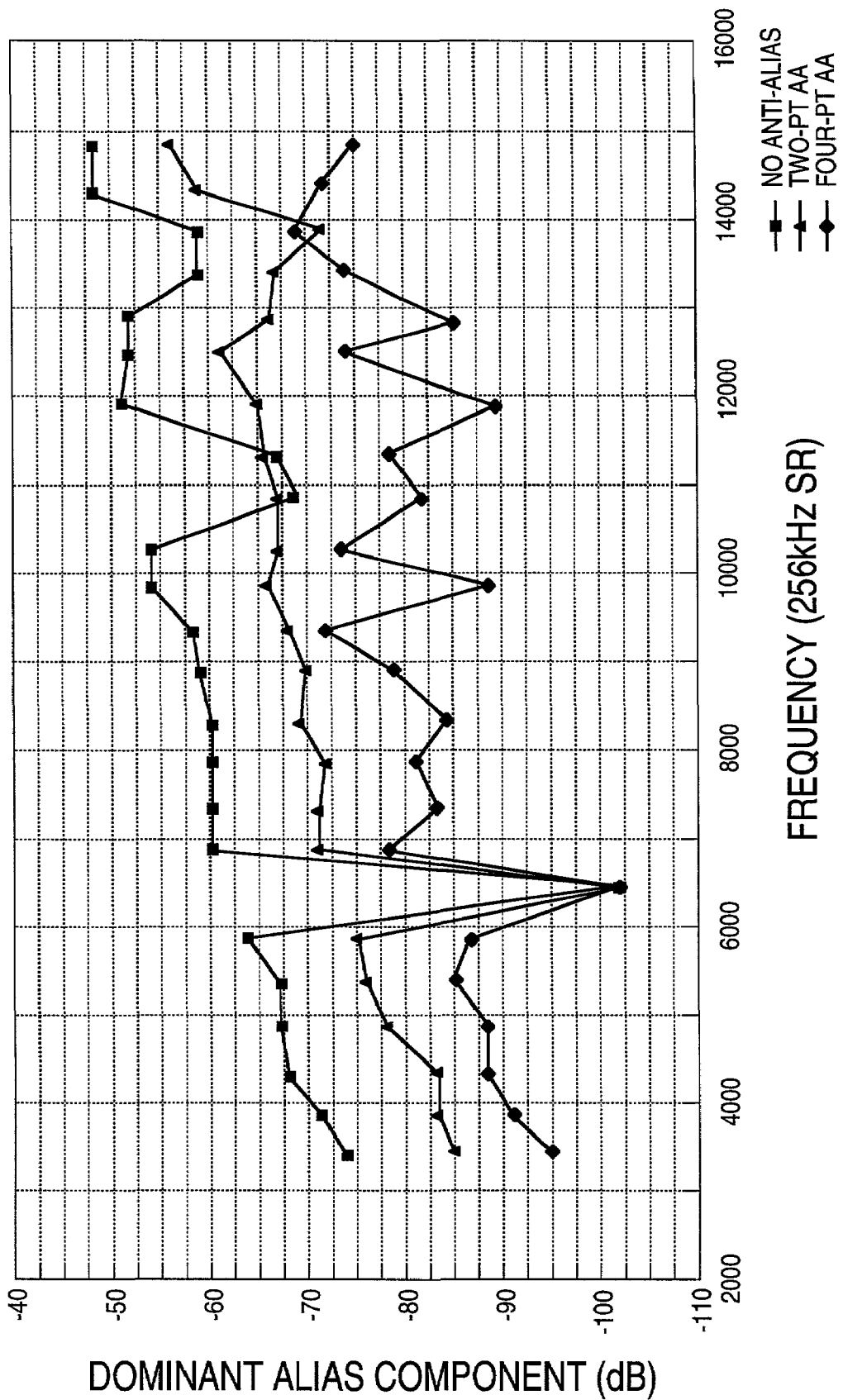
FIG. 7 illustrates the dominant alias components for the cases shown in FIGS. 4, 5 and 6 above, as a function of frequency.
Figure 8:
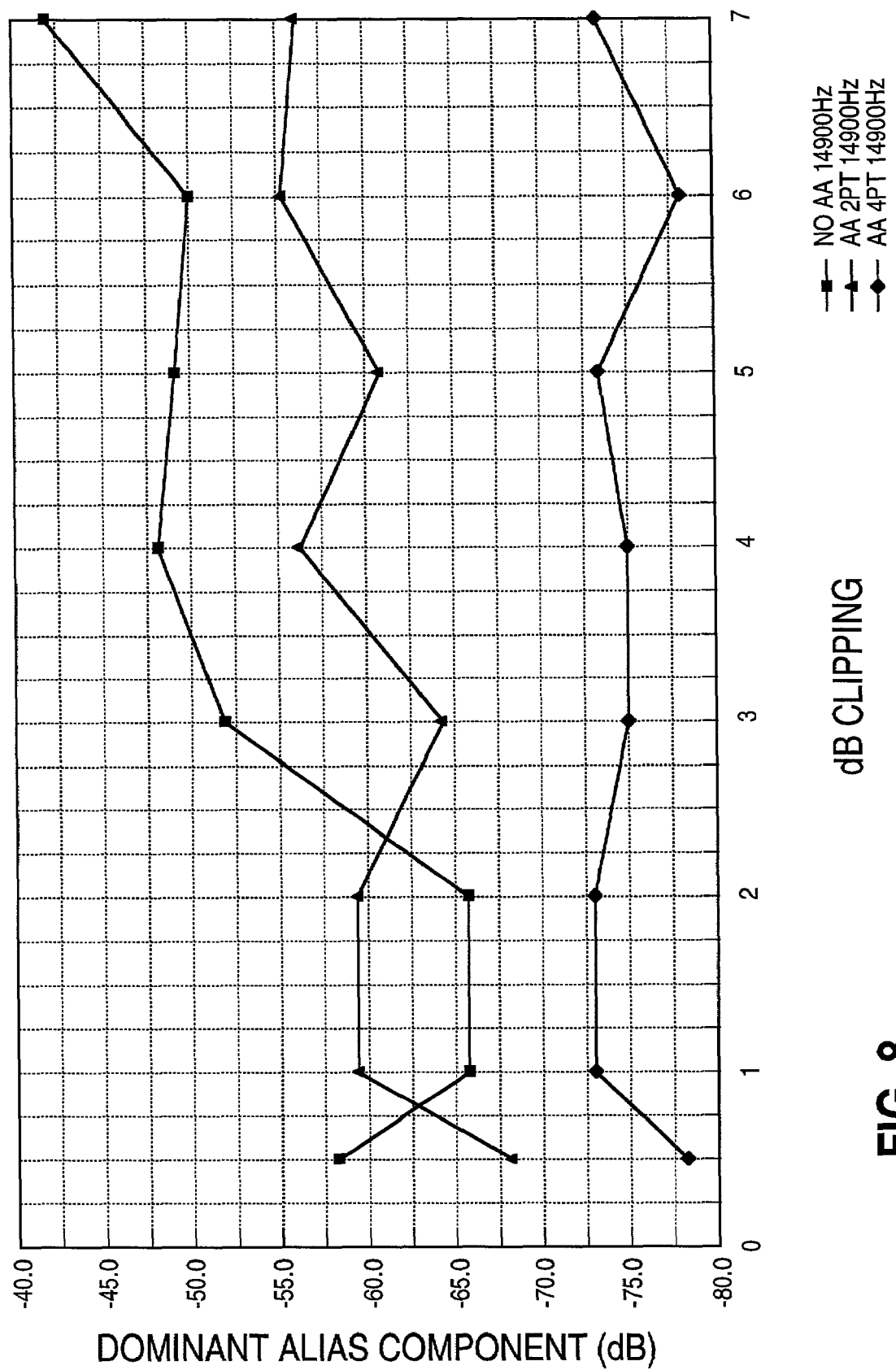
FIG. 8 illustrates the dominant aliasing components for the cases shown in FIGS. 4, 5 and 6 above, as a function of the amount of clipping expressed in dB.

FIGS. 7 and 8 show the relative performance of the two-sample and four-sample anti-aliasing algorithms as compared to no anti-aliasing. FIG. 7 shows aliasing as a function of frequency with a constant clipping depth of 4 dB. The sample rate is assumed to be 256 kHz.

FIG. 8 shows anti-aliasing as a function of clipping depth for 14,900 kHz with reference to 256 kHz sample rate. In FIGS. 7 and 8 it is interesting to note that the performance of the algorithms is extremely non-monotonic. Because of the non-linearity of the processing, this is not particularly surprising. In particular, at 6400 Hz the zero crossings of the error signal align exactly with the samples, because there is no aliasing at all at this frequency and clipping depth.

The above described method is realizable using digital signal processing/DSP circuits. For a block of 16 samples at 512 kHz sample rate, for example, two operations (corresponding to two zero crossings) will be needed frequently, while three operations will be needed on approximately 0.02% of the blocks. The algorithm can therefore safely be coded by allocating enough DSP resources to two operations per block, as the failure to anti-alias 0.02% of the zero crossings will have no material effect on performance.

The four-sample technique is currently preferred to the two-sample technique because simulation reveals that it is roughly twice as effective over a wide variety of clipping depths and frequencies. At 256 kHz sample rate, the four point technique is approximately as effective as a sample rate of 5 to 10 MHz without anti-aliasing.

Further, "anti-aliasing" is not a strictly accurate description of the effect of either algorithm. They also reduce the effect of sample-induced jitter because, in a sample-data clipper, the true threshold of clipping is constantly changing with respect to the samples.

Thus, a method for computing anti-aliased "clippings" in the digital domain has been disclosed.

What is claimed is:

1. A method for computing the "clippings" of a bandlimited analog signal in the digital domain comprising:
    subtracting values of a predetermined threshold from each sample of the analog signal to provide an offset signal; and, multiplying the offset signal by a pulse having a bandlimited first step and a bandlimited second step occurring in the opposite sense to the first step.

2. The method defined by claim 1 including the step of aligning in time the offset signal and the pulse.

3. The method defined by claim 1 wherein positive and negative predetermined thresholds are used to provide a positive and a negative offset signal which are multiplied by a pulse.

4. A method for computing the "clippings" of a bandlimited analog signal in the digital domain comprising the steps of:

providing a pair of bandlimited step functions, one positive-going and one negative-going;

summing the two step functions to produce a pulse function;

subtracting the value of a predetermined clipping threshold from each of the samples of the analog signal to produce an offset signal; and multiplying the offset signal and the pulse function.

5. The method defined by claim 4 wherein the pulse function has a duration approximately equal to the time that the analog signal exceeds the predetermined threshold.

6. The method defined by claim 5 wherein the step function is provided by numerically integrating the impulse response of an oversampled finite impulse response filter with an oversampled ratio of r.

7. The method defined by claim 6 wherein the filter has a bandpass approximately equal to the bandwidth of the analog signal (fp) and a stopband that starts at approximately fs−2*fp (where fs is the sampling frequency of the offset signal) and stops at the Nyquist frequency of the oversampled finite impulse response filter, 0.5*r*fs.

8. The method defined by claim 4 including a step of lining up in time the samples of the analog signal and the pulse function for the multiplication step.

9. The method defined by claim 8 wherein the lining up step comprises:

developing an expression for each of the step functions; and determining the placement in time of the threshold between samples of the analog signal that bound the threshold by interpolation between the samples for both the positive-going and negative-going step function.

10. The method defined by claim 8 wherein the lining up step comprises:

storing values representing the step functions;

determining the placement of the threshold between samples of the analog signal that bound the threshold by interpolation between the samples bounding the threshold.

11. A method for computing the "clippings" of a bandlimited analog signal in the digital domain comprising the steps of:

providing a pair of bandlimited step functions, one positive-going and one negative-going;

developing an expression for each of the functions;

summing the two step functions to produce a pulse function;

subtracting the value of a predetermined clipping threshold from each of the samples of the analog signal to produce an offset signal;

determining the placement in time of the threshold between samples of the analog signal that bound the threshold by interpolation between the samples for both the positive-going and negative-going step function, and multiplying the offset signal and the pulse function.

12. A method for computing the "clippings" of a bandlimited analog signal in the digital domain comprising the steps of:

providing a pair of bandlimited step functions, one positive-going and one negative-going;

storing values representing the step functions;

summing the two step functions to produce a pulse function;

subtracting the value of a predetermined clipping threshold from each of the samples of the analog signal to produce an offset signal;

determining the placement of the threshold between samples of the analog signal that bound the threshold by interpolation between the samples bounding the threshold, and multiplying the offset signal and the pulse function.

* * * * *